United States Patent [19]

Andersson et al.

[11] Patent Number: 5,398,159
[45] Date of Patent: Mar. 14, 1995

[54] MODULAR PACKAGING SYSTEM

[75] Inventors: Nils A. T. Andersson; Nils U. H. Fagerstedt, both of Jarfalla; Bjorn G. Gudmundsson, Sollentuna, all of Sweden

[73] Assignee: Telefonaktiebolaget LM Ericsson, Sweden

[21] Appl. No.: 990,515

[22] Filed: Dec. 15, 1992

[51] Int. Cl.$^6$ ............................................. H05K 7/20
[52] U.S. Cl. ................................. 361/695; 361/724; 361/728; 361/735; 361/826
[58] Field of Search ............... 361/383, 384, 390–391, 361/399, 415, 688, 690–697, 724–727, 729–730, 735, 744, 826

[56] References Cited

U.S. PATENT DOCUMENTS

| | | | |
|---|---|---|---|
| 3,562,593 | 2/1971 | Bould | 361/342 |
| 4,002,955 | 1/1977 | Eggert et al. | 361/391 |
| 4,149,218 | 4/1979 | Carrubba et al. | 361/384 |
| 4,313,149 | 1/1982 | Hirose et al. | 361/826 |
| 4,447,856 | 5/1984 | Takahashi et al. | 361/383 |
| 4,694,484 | 9/1987 | Atkinson et al. | |
| 4,758,924 | 7/1988 | Dillon et al. | 361/383 |
| 4,774,631 | 9/1988 | Okuyama et al. | 361/395 |

FOREIGN PATENT DOCUMENTS

| | | | |
|---|---|---|---|
| 0059410 | 9/1982 | European Pat. Off. | |
| 2211268 | 9/1973 | Germany. | |
| 4094595 | 3/1992 | Japan | 361/690 |
| 2233505 | 9/1991 | United Kingdom | 361/826 |
| WO92/15188 | 9/1992 | WIPO. | |

Primary Examiner—Gregory D. Thompson
Attorney, Agent, or Firm—Burns, Doane, Swecker & Mathis

[57] ABSTRACT

In a modular packaging system for electrical equipment, two or more modules are arranged horizontally or vertically relative to one another. Each module includes electrical equipment, a cabinet in which the electrical equipment is disposed, and a fan assembly for forcing air through the cabinet to cool the electrical equipment. The cabinet includes an inner cabinet wall forming an air shaft, a vertical space extending between a top and a bottom opening in the cabinet, and a horizontal space extending between a left and a right opening in the cabinet. The cabinet is further formed with a first and a second opening. The second opening is formed in the inner cabinet wall. The fan assembly forces air through the first opening of the cabinet, past the electrical equipment, out the second opening of the cabinet, and into the air shaft. The modular packaging system further includes a chimney formed by aligning the air shafts of two or more modules arranged vertically relative to one another and a vertical cable chute formed by aligning the vertical spaces of the two or more vertically arranged modules. The modular packaging system further includes a horizontal cable chute formed by aligning the horizontal spaces of two or more modules arranged horizontally relative to one another.

30 Claims, 12 Drawing Sheets

MODULAR PACKAGING SYSTEM

BACKGROUND

The present invention relates to a packaging system for electrical equipment and, more particularly, to a modular packaging system.

In designing electrical equipment packages, sufficient ventilation to prevent overheating of various heat-generating parts is a necessary consideration. Generally desirable features of such packages include ease of forming electrical connections between individual components inside of the package with other components, including components external to the package, and ease of access to the packaged electrical equipment. Such features facilitate maintenance tasks such as repair or replacement of individual components or groups of components. Further, it is desirable to provide the foregoing features in packages of minimal size.

With the advent of large electronic systems such as cellular telephone communication systems, it is necessary to package large amounts of equipment. For example, in U.S. Pat. No. 4,694,484 to Atkinson et al., it is noted that components that make up cellular telephone communication systems include large amounts of common equipment, and that the use of such equipment has led to interconnections between various functional modules. To package large amounts of electrical equipment such as equipment typically belonging to radio base stations of cellular telephone communication systems, i.e., printed board assemblies, combiners, high power equipment, AC/DC equipment, antenna near parts, distribution blocks, power connection blocks, power splitters, etc., it is desirable to provide a modular packaging system that simplifies system design, customization, and expansion, as well as simplifying system construction and maintenance.

Existing packages for such equipment generally consist of conventional cabinets in which holes are drilled or punched. Cables are extended through the holes so that electrical connections between individual components in one cabinet can be formed with components in other cabinets and elsewhere. In view of the labor necessary in punching the holes and forming electrical connections between different cabinets, it is desirable to provide a modular packaging system in which interconnection of electrical components in different modules is simplified.

In existing packaging systems, each cabinet is typically provided with a fan for ventilating the equipment in the cabinet and blowing air to outside of the cabinet. The heated air blown outside of the cabinet by the fan may linger around the cabinet, and heat the area immediately around the cabinet. The heated air may create an uncomfortable or dangerous condition. In view of the potential of such conditions, it is therefore desirable to provide an improved system of ventilating air heated by electrical equipment.

SUMMARY

In accordance with one aspect of the present invention, a modular packaging system for electrical equipment is formed by two or more modules. Each module includes electrical equipment, a cabinet in which the electrical equipment is disposed, and means for forcing air through the cabinet to cool the electrical equipment. The cabinet includes an inner cabinet wall forming an air shaft and is formed with a first and a second opening. The second opening is formed in the inner cabinet wall. The air forcing means force air through the first opening of the cabinet, past the electrical equipment, out the second opening of the cabinet, and into the air shaft such that the electrical equipment is continuously cooled. A chimney is formed by aligning the air shafts of two or more modules arranged vertically relative to one another.

In accordance with a further aspect of the present invention, the cabinet further includes a vertical space extending between a top and a bottom opening in the cabinet. The modular packaging system further comprises a vertical cable chute formed by aligning the vertical spaces of two or more modules arranged vertically relative to one another.

In accordance with a further aspect of the present invention, the cabinet further includes a horizontal space extending between a left and a right opening in the cabinet. The modular packaging system further comprises a horizontal cable chute formed by aligning the horizontal spaces of two or more modules arranged horizontally relative to one another.

In accordance with a further aspect of the present invention, the cabinet has four sides and includes four horizontal arms extending in the same direction from four corners of the cabinet. A cover is removably attachable to ends of the four arms. The cover, the arms, and the sides define the top and bottom openings between which the vertical space extends and the left and right openings between which the horizontal space extends.

In accordance with further aspects of the present invention, each module further includes means, disposed in the cabinet, for distributing air forced past the electrical equipment by the air forcing means in a primary air flow pattern. The air forcing means includes a pair of fans. The distributing means is formed such that, upon failure of either one of the fans, a secondary air flow pattern is established.

In accordance with a further aspect of the present invention, each module further includes an air-permeable subrack assembly in which the electrical equipment is mounted. The subrack assembly is mounted in the cabinet such that first and second spaces are formed between the subrack assembly and the cabinet. The first and second spaces extend to the first and second openings, respectively.

In accordance with another aspect of the present invention, a module for a modular packaging system includes a cabinet. The cabinet has four sides and four horizontal arms extending in the same direction from four corners of the cabinet. The cabinet includes a cover removably attachable to ends of the four arms. The cover, the arms, and the sides define top and bottom cabinet openings between which a vertical space extends and left and right cabinet openings between which a horizontal space extends. The cover is formed with apertures, and the cabinet being formed with an outlet opening. The module further includes an air-permeable subrack assembly. Electrical equipment is adapted to be mounted in the interior of the subrack assembly. The subrack assembly is mounted in the cabinet such that first and second spaces are formed between the subrack assembly and the cabinet. The first and second spaces extend to the apertures in the cover and the outlet opening, respectively. The module further includes means for forcing air through the apertures in the cover, through the subrack assembly, and out the outlet opening of the cabinet to permit continuous cooling of the interior of the subrack assembly. The module is adapted to be vertically arranged relative to another module such that the vertical spaces of the modules are aligned, and the module is adapted to be horizontally arranged relative to another module such that the horizontal spaces of the modules are aligned.

In a further aspect of the present invention, the module further comprises means, disposed both on the exterior of and on the interior of the subrack assembly, for forming electrical connections with electrical equipment mounted in the interior of the subrack assembly.

In a further aspect of the present invention, the cabinet further includes an interior cabinet wall defining, with a rear wall and portions of left and right walls of the cabinet, an air shaft. The air shaft extends between the outlet opening of the cabinet and a bottom opening of the cabinet. The interior cabinet wall is formed with an interior cabinet wall opening through which air forced by the air forcing means through the subrack assembly passes to the air shaft and out the outlet opening of the cabinet.

In a further aspect of the present invention, the module further comprises a passage extending between an opening in the inner cabinet wall and an opening in the rear wall. When the module is horizontally arranged relative to another module, the openings in the rear walls of the modules are aligned.

In accordance with a further aspect of the present invention, when the module is vertically arranged relative to another module, the air shaft of the modules are aligned and form a chimney.

BRIEF DESCRIPTION OF THE DRAWINGS

The features and advantages of the present invention will be understood by reading the following detailed description in conjunction with the drawings in which like numerals indicate like elements and in which.

DETAILED DESCRIPTION

Figure 1:
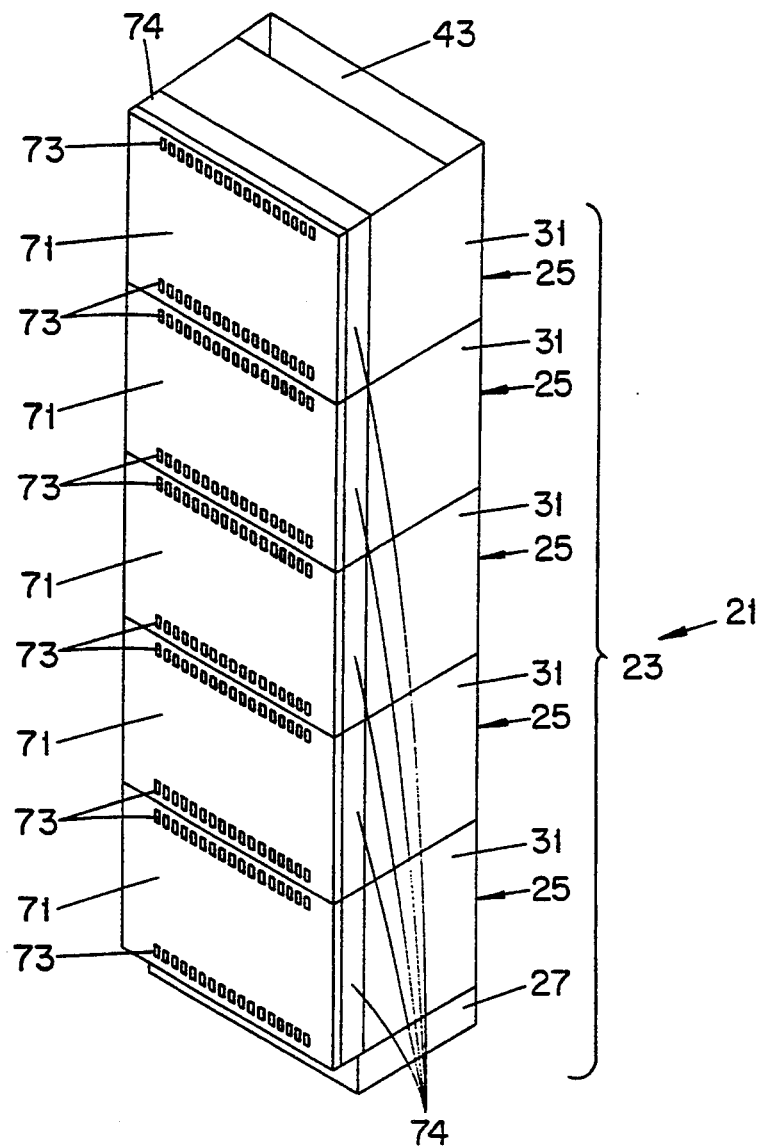
FIG. 1 is a perspective view of a module stack according to an embodiment of the present invention.
Figure 2A:
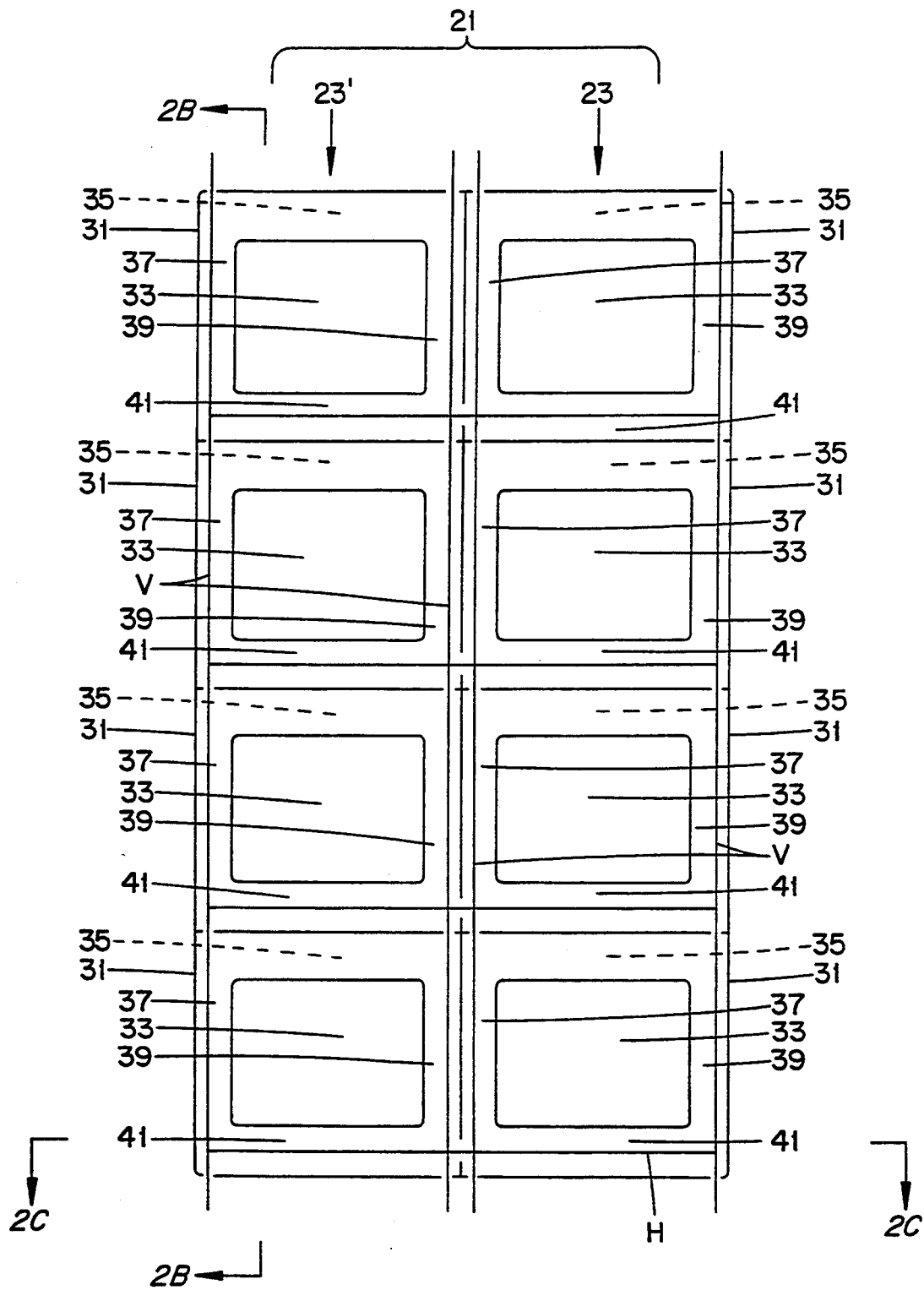
FIG. 2A is a front, cross-sectional schematic view of a modular packaging system according to an embodiment of the present invention.
Figure 2B:
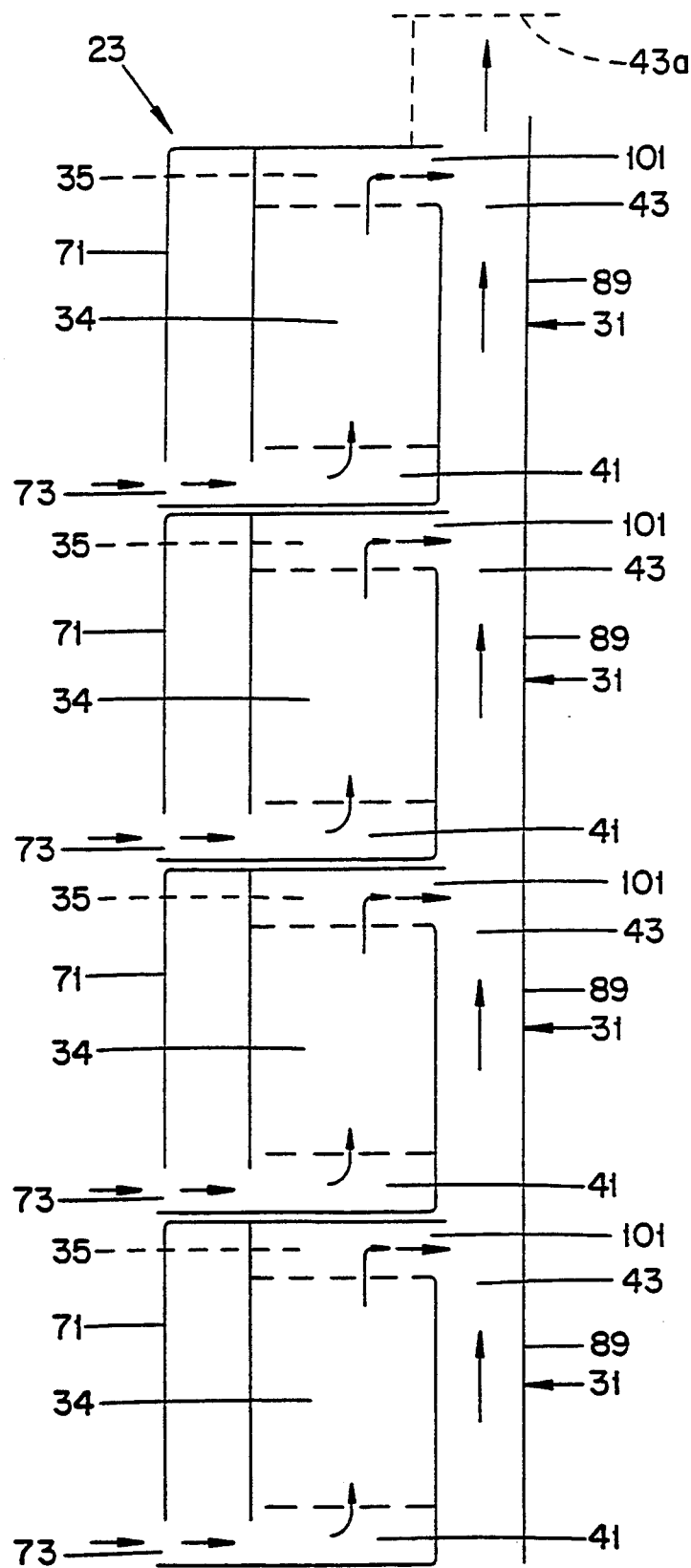
FIG. 2B is a side, cross-sectional schematic view of the modular packaging system of FIG. 2A taken at section 2B—2B.
Figure 2C:
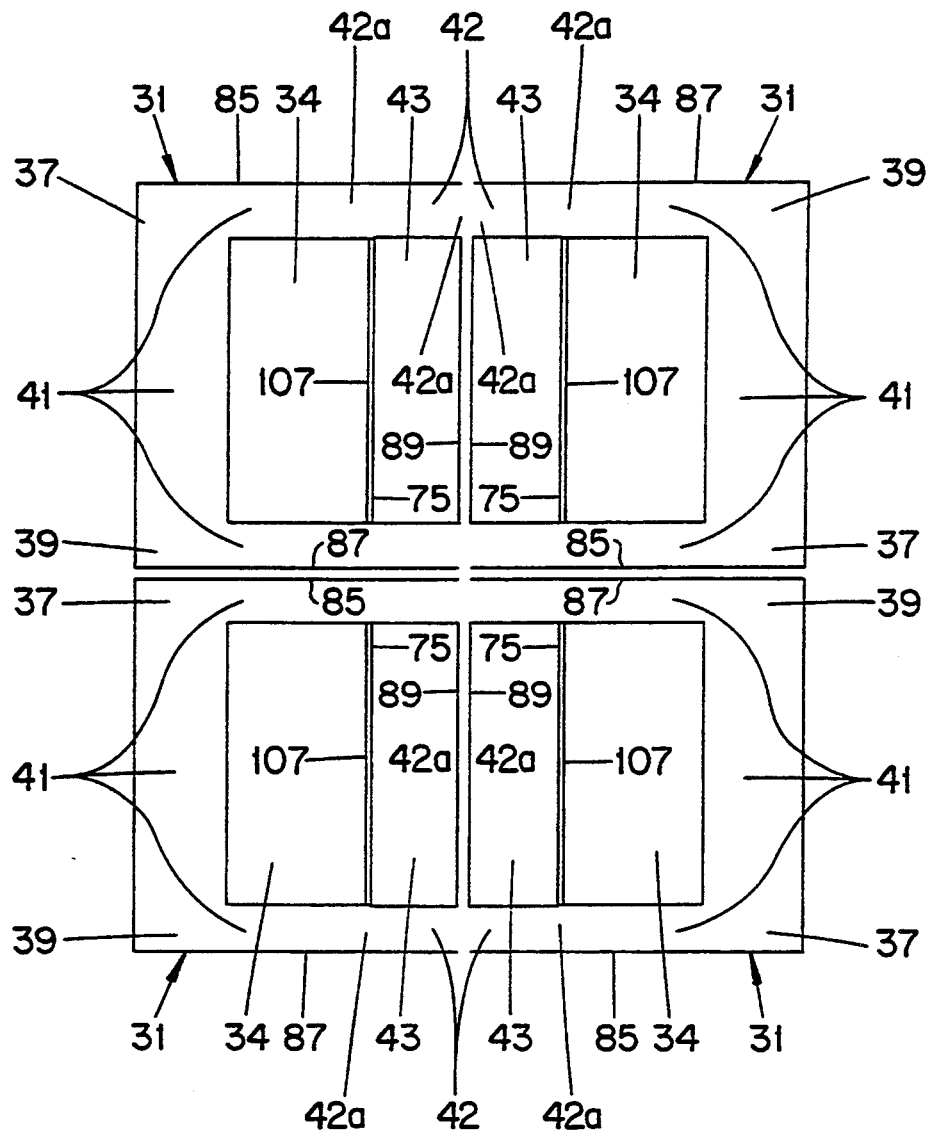
FIG. 2C is a top, cross-sectional schematic view of the modular packaging system of FIG. 2A taken at section 2C—2C.

With reference to FIGS. 1 and 2A, 2B, and 2C, a modular packaging system 21 for electrical equipment is shown. The modular packaging system 21 includes two or more modules 25, which are adapted to be arranged vertically relative to one another in a stack 23, as seen, for example, in FIGS. 1, 2A, and 2B. The modules 25 of the modular packaging system 21 are also adapted to be arranged horizontally relative to one another in a side-by-side relationship, as seen in FIG. 2A, and in a back-to-back relationship, as seen in FIG. 2C. Further, as seen in FIG. 2A, each stack 23 of modules 25 is adapted to be horizontally arranged relative to one another, next to another stack 23'. The modules 25 and stacks 23 of modules may also, of course, be secured to walls by means such as bolts.

Each module 25 contains electrical equipment (not shown). Some of the electrical equipment may generate relatively substantial amounts of heat which must be dissipated to prevent damage or equipment malfunction. In accordance with a preferred embodiment, the electrical equipment is equipment for use in a radio base station of a cellular telephone communication system.

Figure 3:
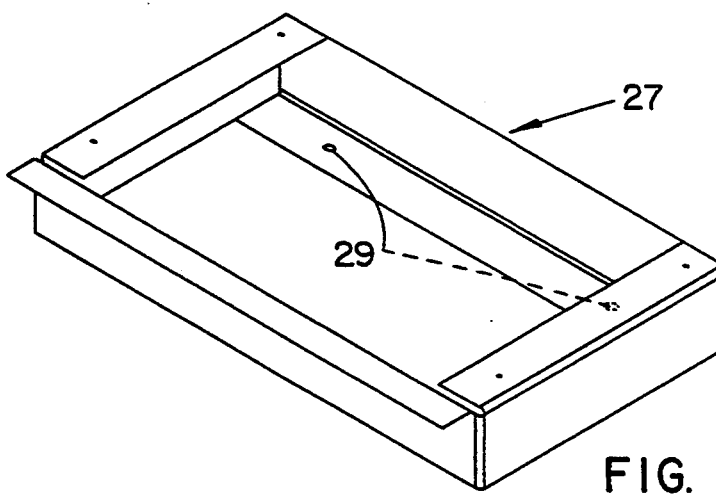
FIG. 3 is a perspective view of a base for a module according to an embodiment of the present invention.

The modules 25 are preferably raised from direct contact with the floor by a base 27. As seen in FIG. 3, the base 27 is preferably formed with bolt holes 29 for securing the base to a floor with bolts (not shown). The base 27 is thus adapted to be secured to different types of floors under many different types of conditions.

Figure 4A:
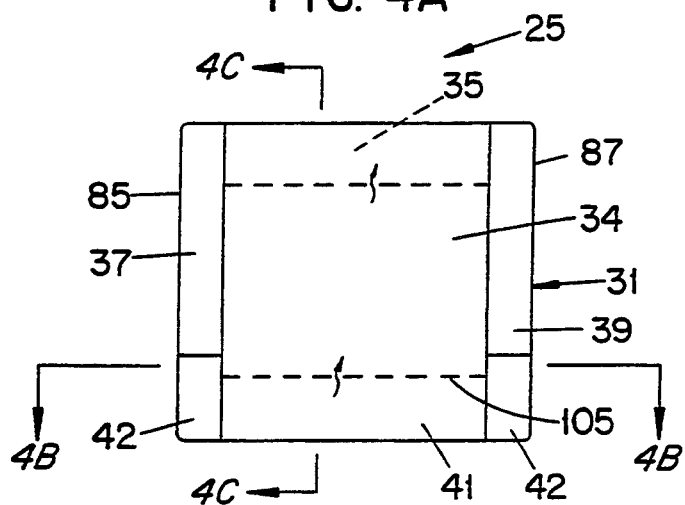
FIG. 4A is a front, cross-sectional schematic view of a module according to an embodiment of the present invention.
Figure 4B:
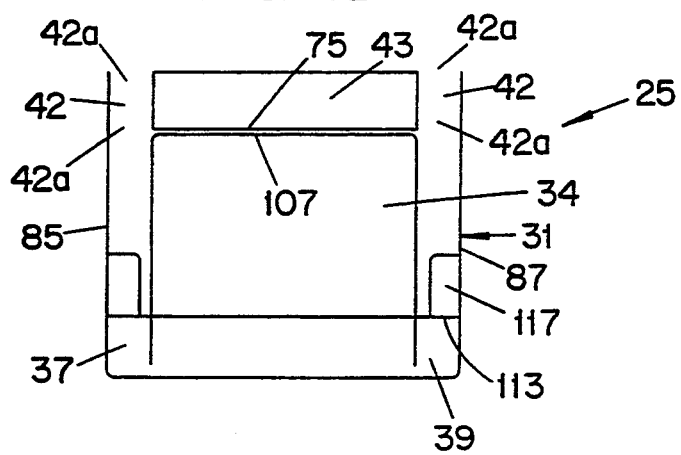
FIG. 4B is a top, cross-sectional schematic view of the module of FIG. 4A taken at section 4B—4B.
Figure 4C:
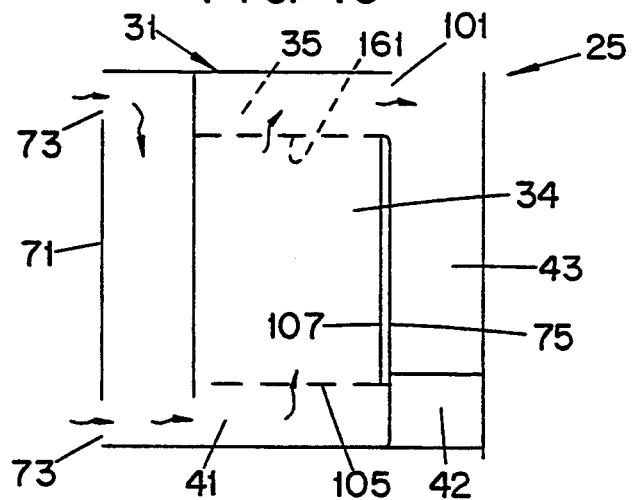
FIG. 4C is a side, cross-sectional schematic view of the module of FIG. 4A taken at section 4C—4C.
Figure 5:
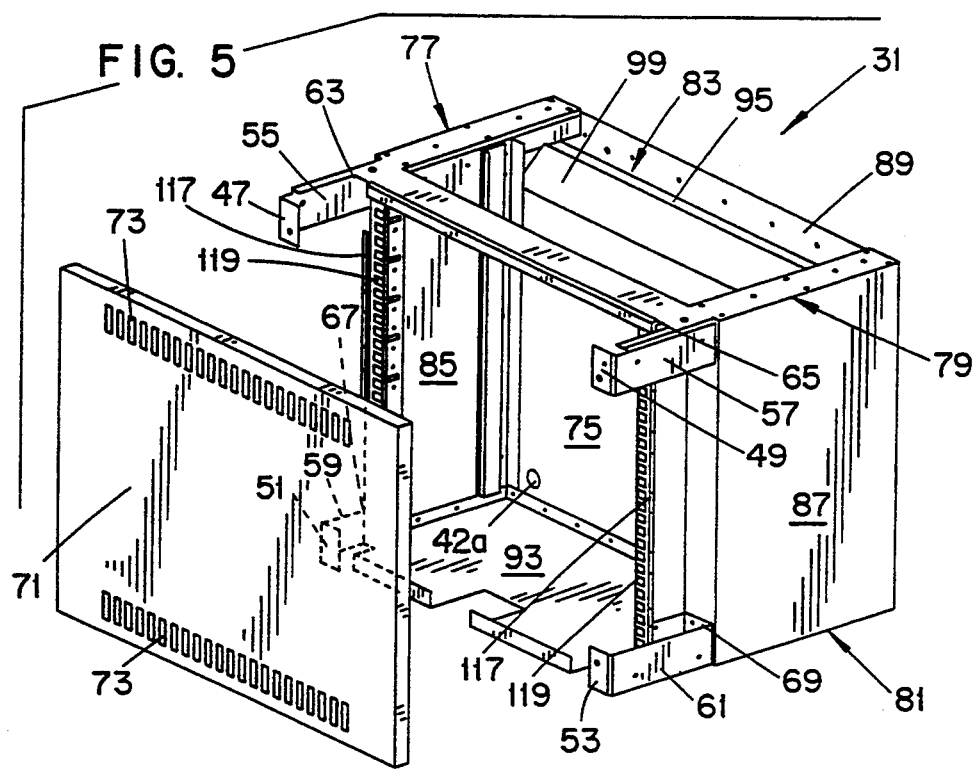
FIG. 5 is a perspective, exploded view of a cabinet of a module according to an embodiment of the present invention.
Figure 6:
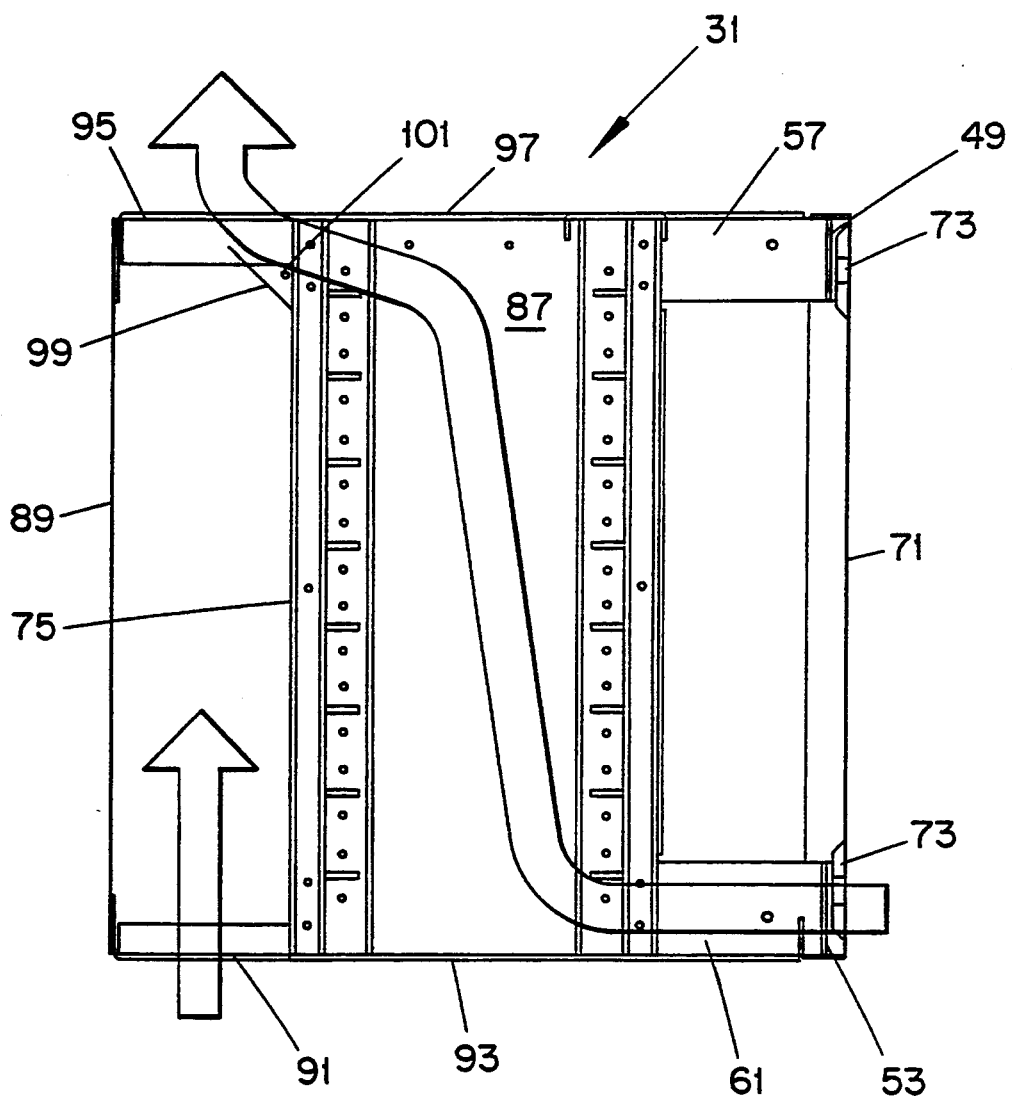
FIG. 6 is a cross-sectional side view of a cabinet of a module according to an embodiment of the present invention.

With reference to FIGS. 4A, 4B, and 4C, a module 25 is shown in schematic form. Each module 25 includes a cabinet 31, such as is seen in FIGS. 5 and 6. Each module 25 further includes a subrack 34. The subrack 34 is part of a subrack assembly 33, seen in FIG. 7, and is adapted to enclose electrical components. As seen in FIGS. 4A, 4B, and 4C, the subrack 34 is mounted in the cabinet 31, and a fan assembly 35 is disposed, in the cabinet, above the subrack for forcing cooling air through the subrack assembly 33 to cool the electrical components disposed therein.

The cabinet 31, the subrack assembly 33 including a subrack 34, and the fan assembly 35 are mounted such that they form a left and right cable chute 37, 39 at the front of the module, and an air intake passage 41 beneath the subrack assembly, as seen, for example, in FIGS. 4A and 4C. As seen in FIG. 2A, the left and right cable chutes 37, 39 and the air intake passages 41 facilitate extending vertical cables V and horizontal cables H, which are preferably shielded, between modules 25 that are positioned vertically or horizontally relative to other modules. As seen in FIG. 2C, one or more passages 42 extend between openings 42a in a rear cabinet wall 89 and an inner cabinet wall 75 to the intake passage 41 to provide access to the interior of cabinets 31 from the rear, such as for purposes of extending cables into the cabinet from the rear. The passages 42 also facilitate extending cables between modules arranged in back-to-back relation. The air intake passage 41 is ordinarily sized such that any horizontal cabling H running through the air intake passage does not excessively block the flow of cooling air through the subrack assembly 33. In accordance with a presently preferred embodiment, the intake passage 41 is sized, and the amount of cables are limited, such that no more than 25% of the passage is blocked.

The cabinet 31 also includes an air shaft 43 formed by the inner cabinet wall 75 behind the subrack assembly 33, as seen in FIGS. 4B and 4C. As seen in FIG. 2B, the air shafts 43 of vertically stacked modules 25 form an air shaft or chimney common to all of the vertically stacked modules. The air shafts 43 forming a common chimney are each sized such that, when cooling air flows through the module 25 to the air shaft to dissipate heat, air pressure in the shaft is lower than air pressure at preceding points in the air flow path, thereby ensuring that air does not stagnate in the module. The fan assembly 35, of course, substantially aids in ensuring air flow. Air in the air shaft 43 is preferably directed upward and out of the shaft by a combination of natural convection and by the fan assembly 35. If desired, a chimney cover 43a is provided over an uppermost one of the air shafts 43 of the vertically stacked modules 25.

As seen in FIG. 5, the cabinet 31 is a substantially square- or rectangular-shaped member. The front of the cabinet 31 is defined by the ends 47, 49, 51, and 53 of four horizontal arms 55, 57, 59, and 61. The arms 55, 57, 59, and 61 extend in the same direction from the left top corner 63, the right top corner 65, the left lower corner 67, and the right lower corner 69 of the cabinet 31.

A cover 71 is removably attachable to the ends 47, 49, 51, and 53 of the arms 55, 57, 59, and 61. The cover 71 is preferably formed with one or more rows of apertures 73 for ventilation of the interior of the cabinet 31. The cover 71, the arms 55, 57, 49, and 61, and the four-sided cabinet 31 define vertical and horizontal openings. As seen in FIG. 1, vertical and horizontal openings of cabinets 31 are adapted to be covered with plates 74, such as at sides and tops of the stacks 23 of the modular packaging system 21.

According to a presently preferred embodiment, the cover 71 is attached to the ends 47, 49, 51, and 53 of the arms 55, 57, 59, and 61 by screws (not shown) so that the cover is adapted to be opened and closed to facilitate access to the interior of the cabinet 31. However, the cover 71 may be attached to the ends 47, 49, 51, and 53 of the arms 55, 57, 59, and 61 by other attaching means, such as hinges (not shown) to form a swinging door. Further, if desired, the cover may be omitted entirely.

The inner cabinet wall 75 extends, horizontally, from the left side 77 to the right side 79 of the cabinet 31 and, vertically, from the bottom side 81 and substantially to the top side 83 of the cabinet. In the embodiment shown in FIG. 5, the inner cabinet wall 75, portions of left and right cabinet walls 85, 87, and the rear cabinet wall 89 define the air shaft 43. The passage is formed by conventional conduit tubing (not shown) extending between openings 42a in the inner cabinet wall 75 and the rear cabinet wall 89. The passage 42 may, alternatively, be defined by additional wall members forming a duct extending through the air shaft 43, such as is shown schematically in FIGS. 4A, 4B, and 4C. The inner cabinet wall 75 preferably also provides structural rigidity to the cabinet 31 by acting as a strut which resists deformation of the cabinet, such as by twisting or compression of the cabinet. Preferably, at least portions of the inner cabinet wall 75 extend across the entire width and height of the cabinet 31 to provide the additional structural rigidity. The inner cabinet wall 75 thus enhances the ability of the cabinet 31 to withstand adverse environmental conditions such as earthquakes.

As seen in FIG. 6, air passes through the air shaft 43 from an opening 91 in the bottom cabinet wall 93 to an opening 95 in the top cabinet wall 97. A top portion 99 of the inner cabinet wall 75 is preferably bent and forms a passage 101 between the top cabinet wall 97 of the cabinet and the inner cabinet wall such that air flow is permitted through the apertures 73 in the cover 71, on through the passage, and out into the air shaft 43. Bending the top portion 99 of the inner cabinet wall 75 facilitates directing the flow of air out of the cabinet 31 in a desired upward direction into the air shaft 43 so that air flow in the air shaft is not hindered. The passage 101 may, however, be formed as a gap between the top cabinet wall 97 and the inner cabinet wall 75, such as by forming the inner cabinet wall so that it does not quite reach the top cover or by forming holes in the inner cabinet wall. Ordinarily, large portions of the top cabinet wall 97 are omitted from the module 25, as seen, for example, in the cabinet 31 shown in FIG. 5, particularly when the module is one of the lower modules in a stack 23 of modules. When the top cabinet wall 97 is omitted from the module 25, the passage 101 is formed between the inner cabinet wall 75 and the bottom cabinet wall 93 of a higher one of the modules in the stack 23.

Figure 7:
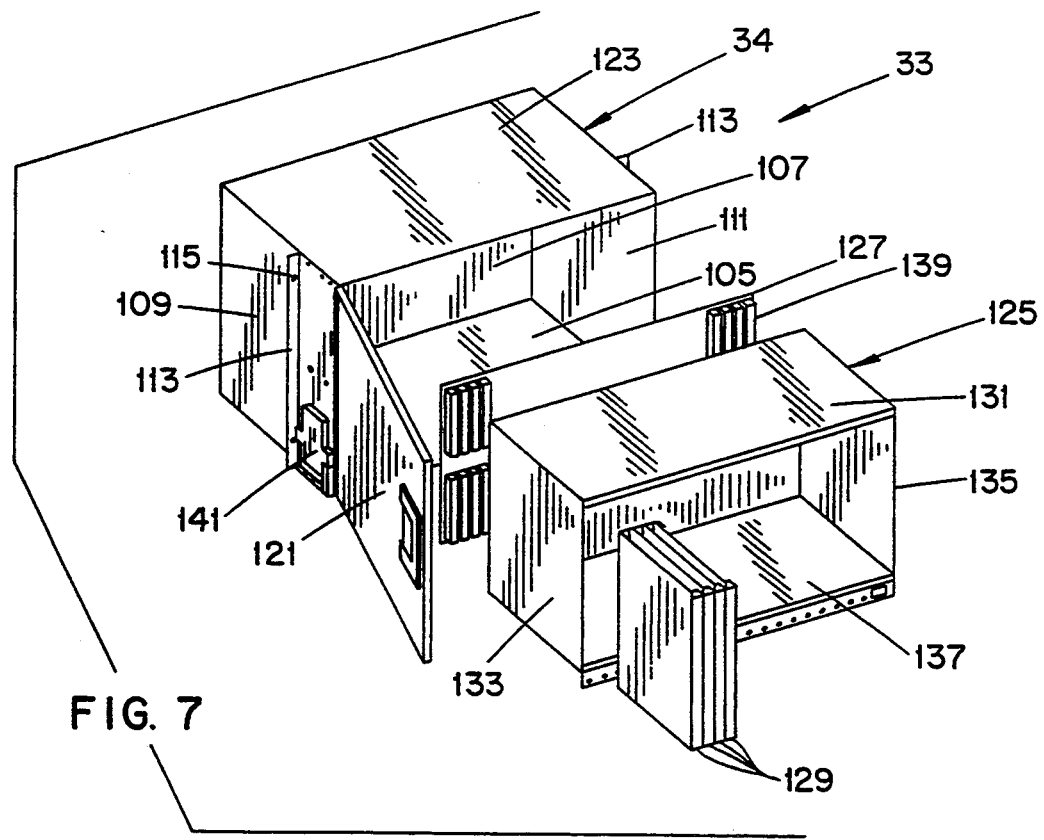
FIG. 7 is a perspective, exploded view of a subrack assembly of a module according to an embodiment of the present invention.

As seen, for example, in FIG. 7, the subrack assembly 33 includes a subrack 34. The subrack assembly 33 is removably mounted in the cabinet 31 such that, as seen in FIGS. 4A and 4C, the air intake passage 41 is formed between the bottom cabinet wall 93 and a bottom subrack wall 105. A rear subrack wall 107 is next to the inner cabinet wall 75.

As seen in FIG. 7, left and right subrack walls 109, 111 preferably include brackets 113 having bolt holes 115 for bolting the subrack 34 in position on attachment assemblies 117 having bolt holes 119 on the left and right cabinet walls 85, 87, as seen in FIG. 5. A forward portion of the subrack 34 preferably extends into the area defined by the arms 55, 57, 59, and 61 of the cabinet 31 and partially defines, with the arms and the cover 71, the left and right cable chutes 37 and 39. The front subrack wall 121 of the subrack 34 may extend so far as to be flush against the cover 71, without covering the apertures 73 in the cover, but preferably partially defines a space between the cover and the front subrack wall, as seen, for example, in FIG. 4C, to facilitate the flow of air entering through any of the apertures in the cover to the intake passage 41.

As seen in FIG. 4A and 4C, the fan assembly 35, which is discussed further below, is mounted in a space defined by the top 123 of the subrack 34 and the top cabinet wall 97 of the cabinet 31. The top 123 of the subrack 34 and the bottom subrack wall 105 are preferably screened or apertured so that the fan assembly 35 forces air from the intake space 41, through the subrack assembly 33, out the passage 101, and into the air shaft 43. By providing the top 123 of the subrack 34 and the bottom subrack wall 105 with numerous, relatively small openings through which air can pass, such as through use of screens or perforated plates, electromagnetic shielding of electrical components in the subrack assembly 33 is facilitated.

The subrack assembly 33 seen in FIG. 7 includes the subrack 34, a card cage 125, and a back plane or wiring unit 127. The card cage 125 fits inside the subrack 34 and is adapted to receive a plurality of printed board assemblies 129 on which electrical components (not shown) are mounted. The card cage 125 includes a top card cage wall 131, a left card cage wall 133, a right card cage wall 135, and a bottom card cage wall 137 and the back plane or wiring unit 127 is disposed at a rear edge of the card cage. The top card cage wall 131 and the bottom card cage wall 137, like the top 123 of the subrack 34 and the bottom subrack wall 105, permit the flow of air forced through the subrack assembly 33 by the fan assembly 35 and are preferably screened or apertured.

It is, of course, possible to mount electrical equipment other than equipment of the type that can be mounted on printed board assemblies 129 in the subrack 34. For example, other equipment may be provided with brackets for attachment to the attachment assemblies 117 in the cabinet, or may be placed in the subrack 34 so that the brackets 113 on the subrack can be attached to the attachment assemblies. Such equipment includes printed board assemblies 129, combiners, high power equipment, AC/DC equipment, distribution units, power connection blocks, power splitters, etc. Further, the equipment includes antenna near parts such as star junctions, directional couplers, diversity equipment, etc. Components on printed board assemblies 129 include transceiver modules, reference oscillator units, channel tester modules, signal strength receiver modules, power monitor units, control channel redundancy switches, control channel modules, etc.

Printed board assemblies 129 on which electrical components are mounted are vertically arranged in the card cage 125 so that air flow through the bottom subrack wall 105 and the bottom card cage wall 137 is forced past the printed board assemblies to provide cooling and flows out of the top card cage wall 131 and through the top 123 of the subrack 34. Cooling of the subrack 34, the back plane or wiring unit 127, the card cage 125, the printed board assemblies 129 or other features of the module 25 may be further facilitated by providing fins (not shown) on those features so that greater surface area of the features is exposed to cooling air flow forced through the module by the fan assembly 35. Some degree of electromagnetic shielding for the electrical components contained in the subrack assembly 33 is preferably provided by one or both of the subrack 34 and the card cage 125, in addition to permitting air flow for ventilation of electrical components.

The printed board assemblies 129 preferably include pins (not shown) for forming electrical connections with banks of receptacle units 139 attached on the back plane or wiring unit 127. The receptacle units 139 on the back plane or wiring unit 127 support the printed board assemblies in an upright position in the card cage 125. Conductors (not shown) electrically connect the receptacle units 139 on the back plane or wiring unit 127 to cables passing a shielding wall of the subrack that are connected to a clamping mechanism 141. The clamping mechanism 141 is mounted on the exterior of the subrack 34. Shielded cables (not shown) from other modules 25 or from points external to the modular packaging system 21 are clamped by the clamping mechanism 141 and are thereby grounded to the subrack 34. The cables are then connected to electrical components mounted on the printed board assemblies 129 through the conductors, the receptacle units 139 on the back plane or wiring unit 127, and the pins on the printed board assemblies. The individual printed board assemblies 129 are adapted to be inserted and removed from the subrack assembly 33 without the need for extensive rewiring, thereby facilitating maintenance of the modules 25 by wholly removing and replacing printed board assemblies.

Figure 8:
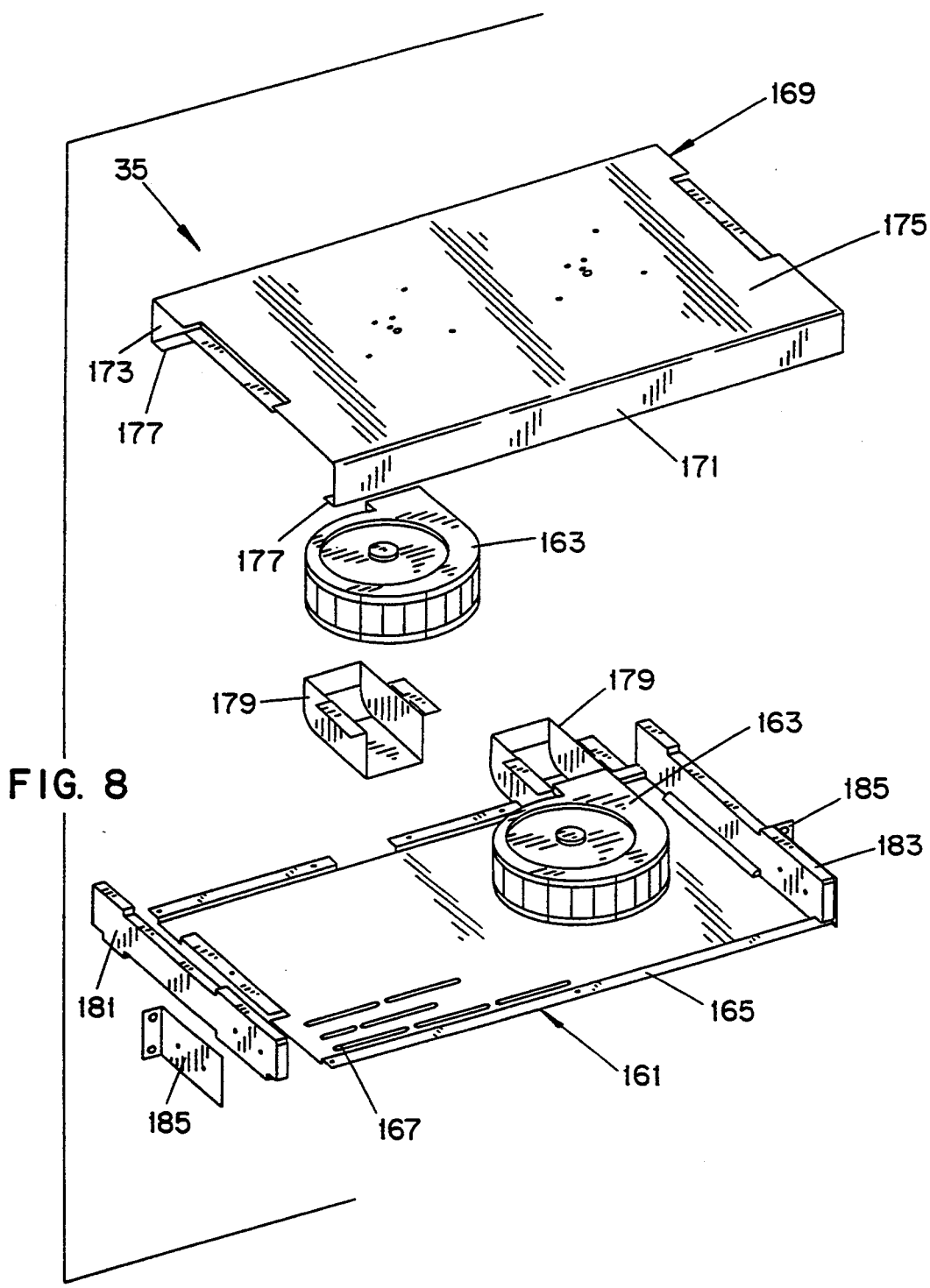
FIG. 8 is a perspective, exploded view of a fan assembly of a module according to an embodiment of the present invention.

The fan assembly 35 is removably mounted in the cabinet 31 above the subrack assembly 33 in the space defined by the top 123 of the subrack 34 and the top cabinet wall 97. As seen, for example, in FIG. 4C, air flow through the module 25 is primarily directed in a path passing through the apertures 73 in the cover 71, through the intake passage 41, vertically up through the subrack assembly 33, through the bottom 161 of the fan assembly 35, through the passage 101, and up into the air shaft 43. As seen in FIG. 8, the fan assembly 35 includes means for forcing cooling air through the module 25, preferably a pair of radial- or centrifugal-type fans 163.

Figure 9:
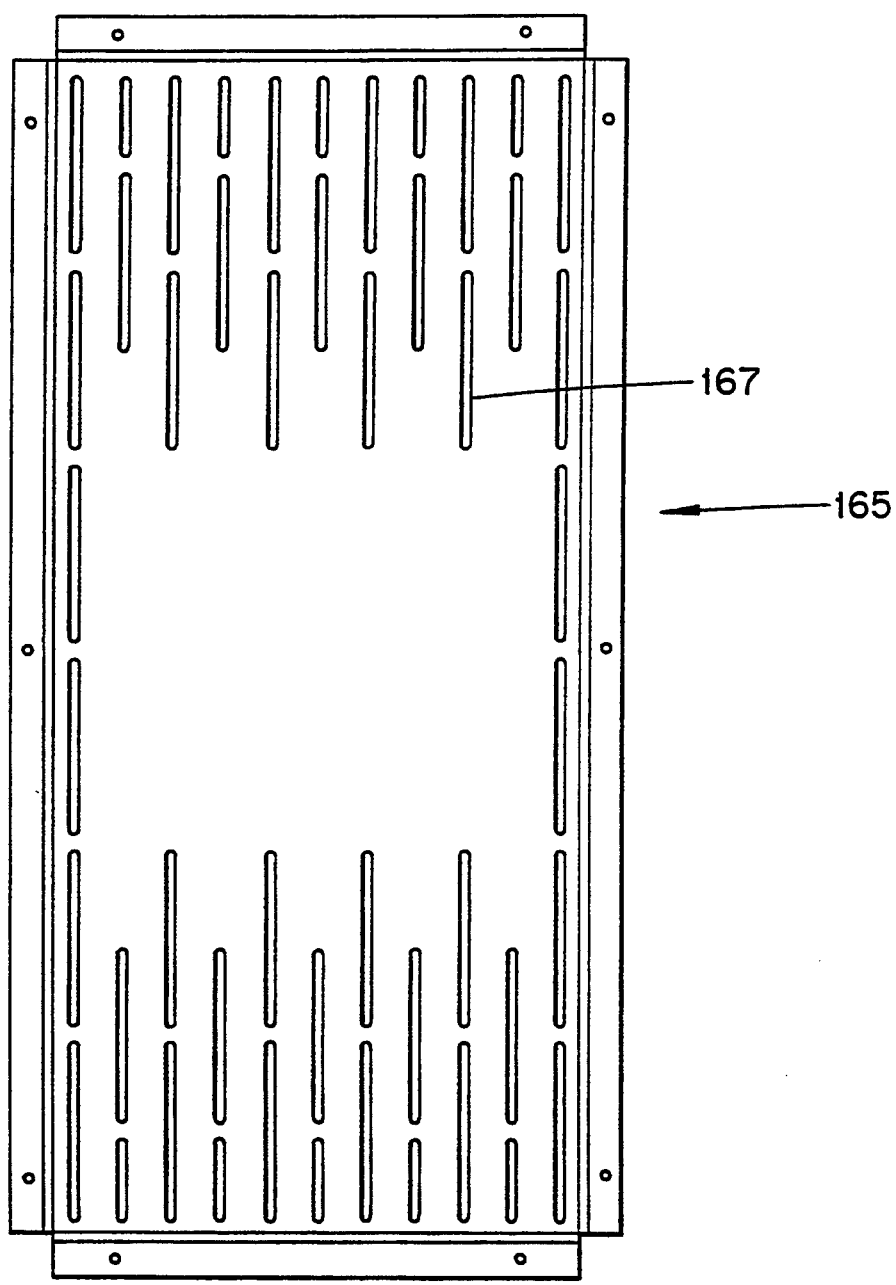
FIG. 9 is a top view of a distribution plate of a module according to an embodiment of the present invention.

The two fans 163 are preferably redundant and provide a ventilation back-up arrangement, in the event that one of the fans is disabled, thereby permitting continued operation of the electrical equipment in the module even after the failure of one of the fans. In accordance with the presently preferred embodiment, the fans 163 are mounted above a distribution plate 165 defining the bottom 161 of the fan assembly with the suction end of the fans facing apertures 167 formed in the distribution plate. As seen, for example, in FIG. 9, the apertures 167 in the distribution plate 165 are formed in patterns which, if necessary, can be arranged to concentrate air flow through the subrack assembly 33 in a desired manner, such as when particular printed board assemblies 129 generate more heat than other printed board assemblies in the card cage 125.

The apertures 167 in the distribution plate 165 are ordinarily arranged in an evenly spaced manner so that the fans 163 develop an even flow through the subrack assembly 33, regardless of whether one fan or both fans are operating. The apertures 167 may be arranged in such a manner that, while both fans 163 operate, a primary air flow pattern through the subrack assembly 33 is established. When one of the fans 163 is disabled, the same arrangement of apertures 167 establishes a secondary air flow pattern, which is preferably substantially identical to the primary air flow pattern, even though only one fan is operating.

The fan assembly 35 further includes a fan housing 169 which is attached over the fans 163 and the distribution plate 165. The fan housing 169 includes a front fan wall 171, a rear fan wall 173, and a top fan wall 175. In accordance with the presently preferred embodiment, the front fan wall 171 and the rear fan wall 173 are formed with bracket portions 177 for bolting the fan housing 169 to the distribution plate 165. Exhaust shafts 179 are preferably connected to each of the fans 163 and extend through cut outs in the rear fan wall 173. The exhaust shafts 179 further direct the flow of air exiting the fan assembly 35 through the passage 101 and upward in the air shaft 43. A left fan wall 181 and a right fan wall 183 are attached, such as by bolts (not shown), to the fan housing 169 and the distribution plate 165. The left fan wall 181 and the right fan wall 183 are preferably attached to brackets 185 for mounting the fan assembly 35 in a desired position on corresponding brackets (not shown) in the cabinet 31.

Figure 10A:
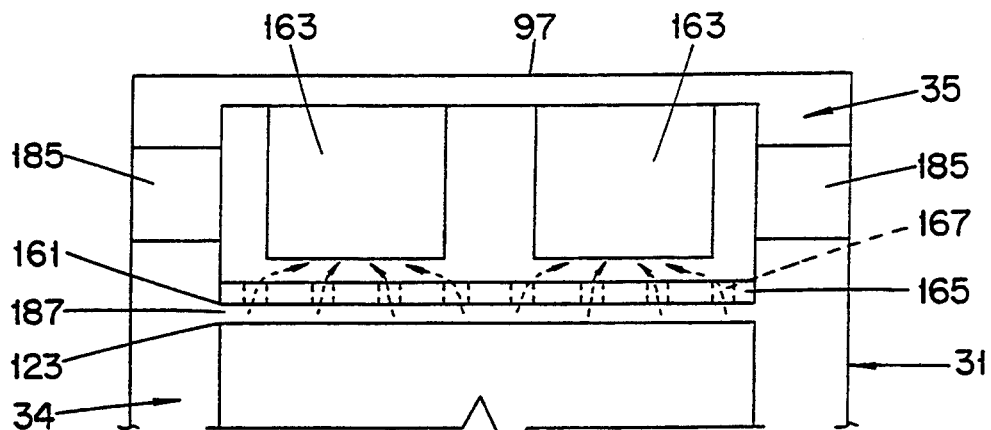
FIGS. 10A, 10B, 10C, and 10D are partially cross-sectional, front schematic views of arrangements for mounting the fan assembly and the subrack in the cabinet according to embodiments of the present invention.

It is desirable to be able to completely remove the fan assembly 35 from the cabinet 31, such as for servicing the fans or so that a new modular fan assembly can be inserted in place of an existing fan assembly. The fan assembly 35 is therefore of a size and shape such that it is easily inserted into and removed from the space defined by the top cabinet wall 97 and the top 123 of the subrack 34. The fan assembly 35 is preferably at least insertable into and removable from the space defined by the top cabinet wall 97 and the top 123 of the subrack through the front of the cabinet 31 when the cover 71 is opened. In accordance with another embodiment, the fan assembly 35 is also insertable into the space between the top cabinet wall 97 and the top 123 of the subrack 34 through the top side 83 of the cabinet through openings in the top cabinet wall 97 when another module 25 is not positioned over the cabinet. In accordance with a presently preferred embodiment, the fan assembly 35 is mounted above the top 123 of the subrack 34 on the top fan wall 175. A small space 187 is formed between the top of the subrack and the distribution plate 165 on the bottom 161 of the fan assembly, as seen in FIG. 10A. The distribution plate 165 facilitates development of an even flow pattern through the subrack assembly 33 by "choking" the air (shown by dotted arrows) in a desired direction, even when one of the fans 163 is not operating.

The suction of the fans 163 and the choking provided by the apertures 167 in the distribution plate 165 make the pressure in the fan assembly 35 lower than the pressure in the choke space 187 and the subrack assembly 33. The pressure differential causes an air flow through each individual aperture 167 proportional to its size. Equally spaced, equally sized apertures 167 causes the development of a substantially even flow pattern over the surface of the distribution plate 165. Variation in aperture 167 size and spacing permits development of a more guided flow pattern, thereby facilitating customizing modules 25 for cooling of different types of electrical equipment. The distribution plate 165 thereby facilitates formation of desired air flow patterns independent of the location of the fans 163 in the fan assembly 35.

Figure 10B:
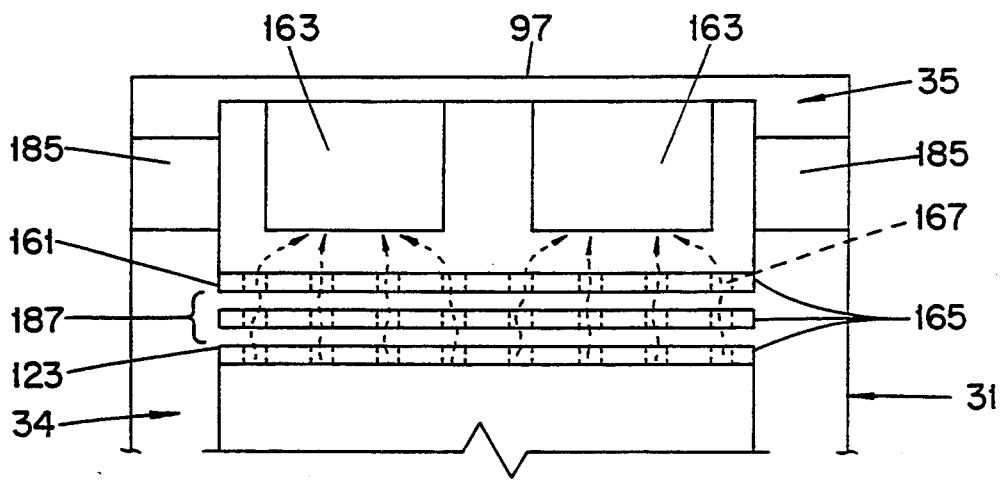

In another embodiment, seen in FIG. 10B, a distribution plate 165 is disposed between an air-permeable bottom 161 of the fan assembly 35 and an air-permeable top 123 of the subrack 34 in the choke space 187. The air-permeable bottom 161 of the fan assembly 35 and the air-permeable top 123 of the subrack 34 may include distribution plates 165. In accordance with still another embodiment, seen in FIG. 10C, distribution plates 165 define the top 123 of the subrack 34 and the bottom 161 of the fan assembly 35 and the choke space 187.

Figure 10C:
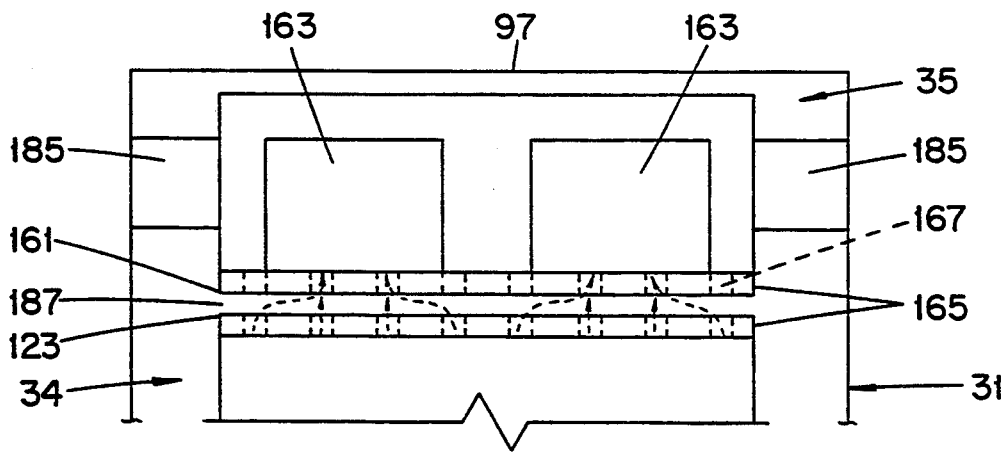
Figure 10D:
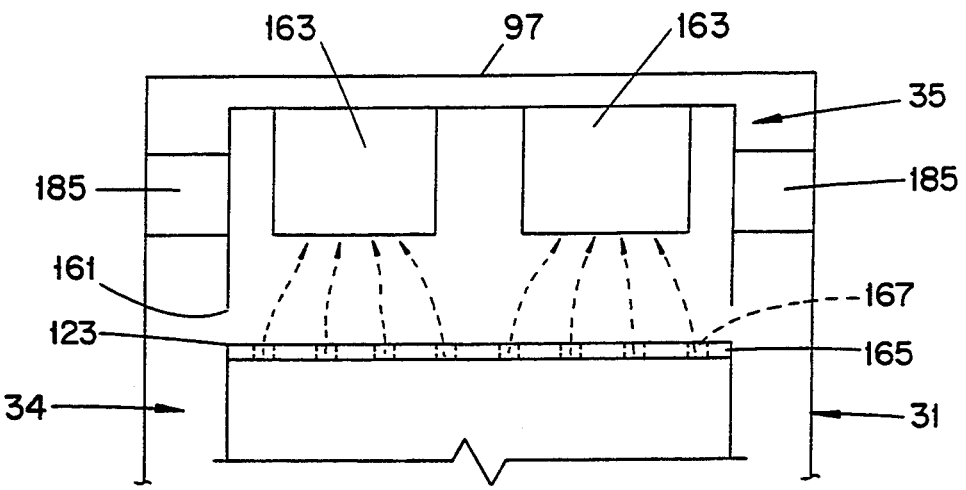

The fans 163 are preferably attached to the top fan wall 175, as seen in FIGS. 10A, 10B, and 10D, and the fan housing is detachable from the subrack 34 and removable from the cabinet 31 for maintenance of the fans. However, the fans 163 may be mounted on another air permeable member, as seen in FIG. 10C, such as another distribution plate 165 defining the bottom 161 of the fan assembly 35. Further, the bottom 161 of the fan assembly 35 may be left open, as seen in FIG. 10D.

Figures 11A, 11B:
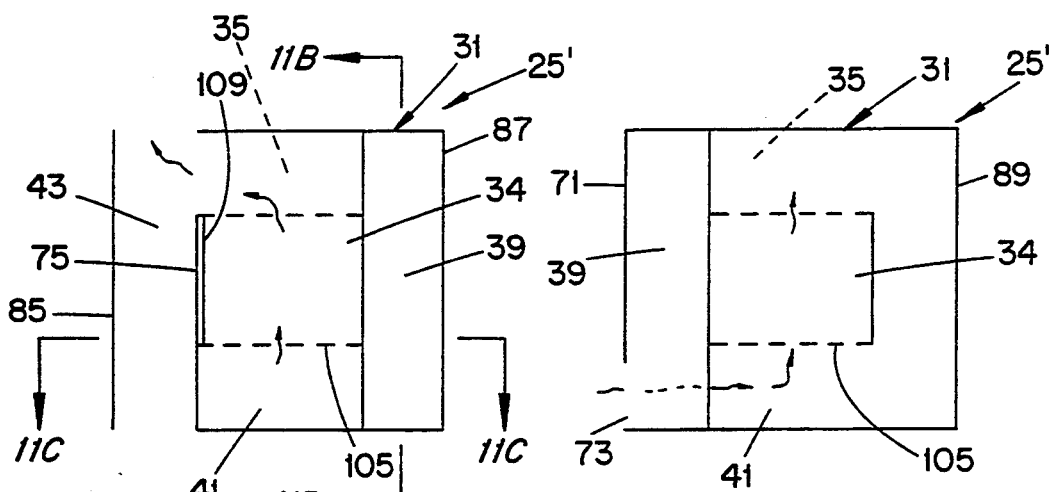
FIG. 11A is a front, cross-sectional schematic view of a module according to another embodiment of the present invention.
FIG. 11B is a side, cross-sectional schematic view of the module of FIG. 11A taken at section 11B—11B.
Figure 11C:
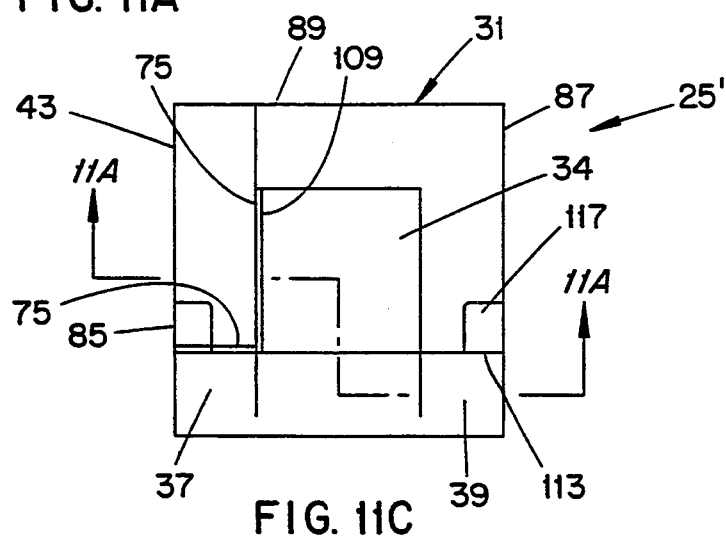
FIG. 11C is a top cross-sectional schematic view of the module of FIG. 11A taken at section 11C—11C.

Thus far, the modules 25 have been described in terms of a preferred embodiment in which an air shaft 43 is defined by the rear cabinet wall 89 and the inner cabinet wall 75. In another embodiment, seen in FIGS. 11A, 11B, and 11C, a module 25' includes an air shaft 43 formed by an inner cabinet wall 75 extending from the rear cabinet wall 89 to a point near the front of the cabinet 31 so that the air shaft is defined by the left cabinet wall 85 and the inner cabinet wall. The air shaft 43 may also be defined by, for example, the right cabinet wall 87 and the inner cabinet wall 75.

Figure 12A:
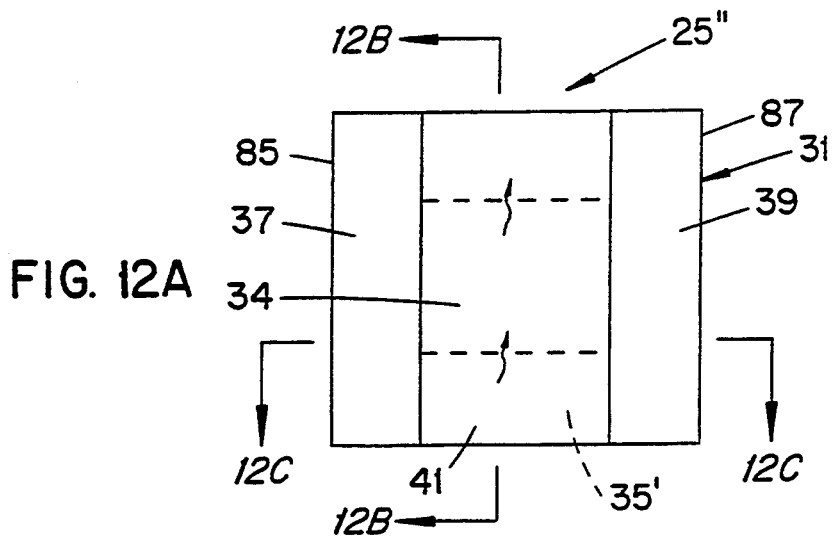
FIG. 12A is a front, cross-sectional schematic view of a module according to another embodiment of the present invention.
Figure 12B:
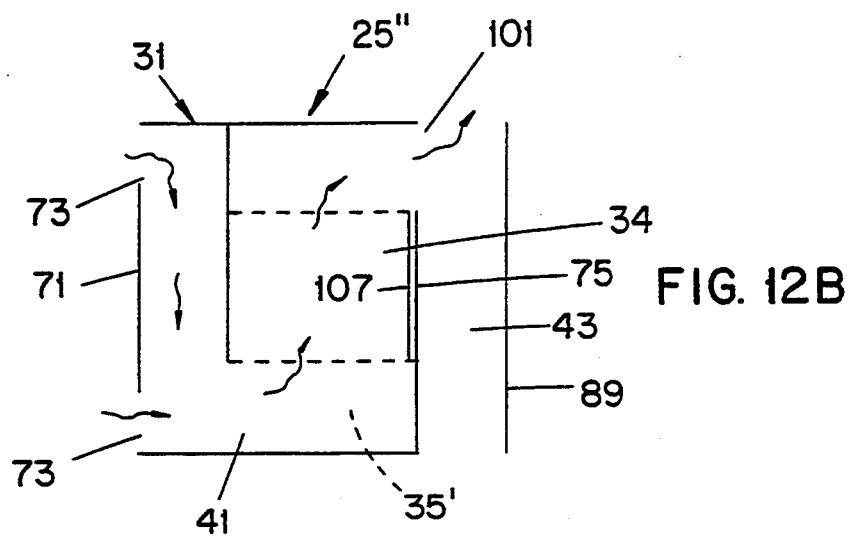
FIG. 12B is a side, cross-sectional schematic view of the module of FIG. 12A taken at section 12B—12B.
Figure 12C:
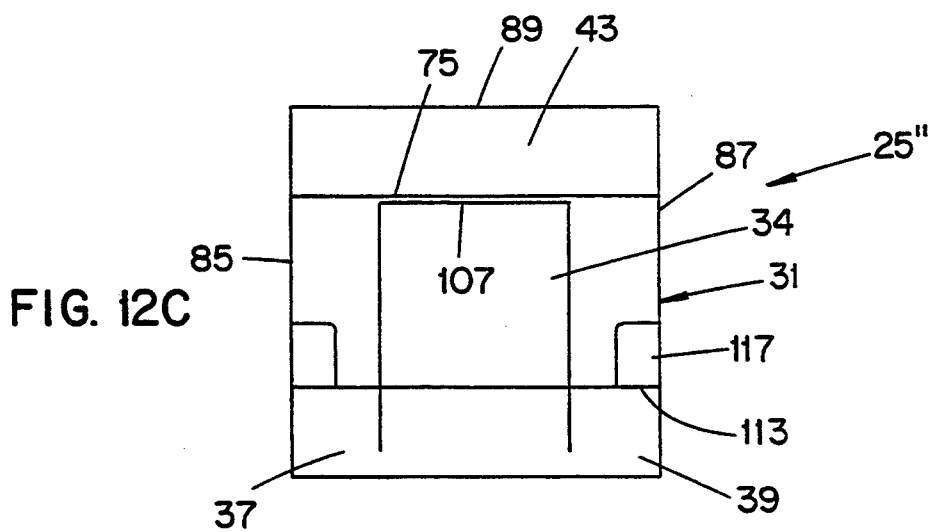
FIG. 12C is a top, cross-sectional schematic view of the module of FIG. 12A taken at section 12C—12C.

Thus far the modules 25 have been described in terms of the preferred embodiment in which fans 163 are mounted above the subrack assembly 33 so that air is sucked through the subrack assembly. In another embodiment, seen in FIGS. 12A, 12B, and 12C, a module 25" includes a fan assembly 35' mounted in the intake space 41 below the subrack 34. The fan assembly 35' blows air vertically up through the subrack assembly 33. Further, the direction of air flow through the module 25 may be reversed or altered from the preferred embodiment in which air is forced vertically upward through the subrack assembly 33. The modules may, for example, provide air flow paths through the subrack whereby the air is forced vertically downward through the subrack assembly 33 or horizontally across the subrack assembly. The fan assembly 35 may, of course, be disposed at any position in which it is capable of forcing sufficient cooling air through the subrack assembly 33.

The modular packaging system 21 facilitates construction and maintenance of customized electronics systems such as radio base stations for cellular telephone communications systems. For example, the individual modules 25 are preferably sized such that they are conveniently carried by an individual. Further, as seen in FIG. 2A, when individual modules 25 are arranged vertically relative to one another, the left and right cable chutes 37, 39 of one module align, respectively, with the left and right cable chutes of upper and lower modules and facilitates forming electrical connections between modules arranged above and below one another. As seen in FIG. 2B, the air shafts 43 of the vertically arranged modules 25 align and form a common chimney, thereby facilitating efficient ventilation of a number of vertically arranged modules.

When modules 25 are arranged horizontally relative to one another in a side-by-side arrangement, the left cable chute 37 of one module is positioned adjacent the right cable chute 39 of another module, as seen in FIG. 2A, thereby facilitating forming electrical connections between modules arranged horizontally, side-by-side. When modules 25 are arranged horizontally relative to one another in a back-to-back arrangement, the openings 42a in the rear cabinet wall 89 are aligned with one another so that the passages 42 in each module extend to the intake passage 41, as seen in FIG. 2C, thereby facilitating forming electrical connections between the modules through the passages and the intake passage. The geometrical flexibility of the modular packaging system 21 permits, in many cases, the use of existing buildings or areas as sites for the system.

Further, the modularity of the modular packaging system 21 lends to simplified construction of customized electronics systems such as radio base stations for cellular telephone communications systems. Standardized units such as interchangeable modules 25 and printed board assemblies 129 can be constructed and tested at a central manufacturing and testing site and warehoused as needed for installation in new, or replacement in existing modular packaging systems 21. The standardization of features of the modular packaging system 21 permits the use of less highly skilled technicians in the construction and maintenance of the system. Further, standardization and interchangeability permit quick replacement of damaged or faulty modular packaging system 21 components, which is of great importance in fields such as communications.

It is, of course, possible to embody the invention in specific forms other than those described above without departing from the spirit of the present invention. The embodiments described above are merely illustrative and should not be considered restrictive in any way. The scope of the invention is given in the appended claims, rather than the preceding description, and all variations and equivalents which fall within the range of claims are intended to be embraced therein.

What is claimed is:

1. A modular packaging system for electrical equipment, comprising:
   two or more modules adapted to enclose electrical equipment, each module including
   a cabinet including an interior adapted to receive the electrical equipment, the cabinet including an inner cabinet wall and a rear cabinet wall, the inner cabinet wall and the rear cabinet wall forming an air shaft, the cabinet being formed with a first and a second opening, the second opening being formed in the inner cabinet wall, and
   means for forcing air through the first opening of the cabinet, through the interior, out the second opening of the cabinet, and into the air shaft such that the interior of the cabinet is continuously cooled; and
   a chimney formed by aligning the air shafts of two or more modules arranged vertically relative to one another.

2. The modular packaging system as set forth in claim 1, wherein, in each module, the cabinet further includes a vertical space extending between a top and a bottom opening in the cabinet, the modular packaging system further comprising a vertical cable chute formed by aligning the vertical spaces of two or more modules arranged vertically relative to one another.

3. The modular packaging system as set forth in claim 1, wherein, in each module, the cabinet further includes a horizontal space extending between a left and a right opening in the cabinet, the modular packaging system further comprising a horizontal cable chute formed by aligning the horizontal spaces of two or more modules arranged horizontally relative to one another.

4. The modular packaging system as set forth in claim 2, wherein, in each module, the cabinet further includes a horizontal space extending between a left and a right opening in the cabinet, the modular packaging system further comprising a horizontal cable chute formed by aligning the horizontal spaces of two or more modules arranged horizontally relative to one another.

5. A modular packaging system for electrical equipment, comprising:
   three or more modules adapted to enclose electrical equipment, each module including
   a cabinet including an interior adapted to receive the electrical equipment, the cabinet including an inner cabinet wall, forming an air shaft, the cabinet being formed with a first and a second opening, the second opening being formed in the inner cabinet wall, the cabinet further including a vertical space extending between a top and a bottom opening in the cabinet, and a horizontal space extending between a left and a right opening in the cabinet, and
   means for forcing air through the first opening of the cabinet, through the interior, out the second opening of the cabinet, and into the air shaft such that the interior of the cabinet is continuously cooled; and
   a chimney formed by aligning the air shafts of two or more modules arranged vertically relative to one another,
   wherein, in each module, the cabinet has four sides and includes four horizontal arms extending in the same direction from four corners of the cabinet and a cover removably attachable to ends of the four arms, the cover, the arms, and the sides defining the top and bottom openings between which the vertical space extends and the left and right openings between which the horizontal space extends, the modular packaging system further comprising a vertical cable chute formed by aligning the vertical spaces of two or more modules arranged vertically relative to one another and a horizontal cable chute formed by aligning the horizontal spaces of two or more modules arranged horizontally relative to one another.

6. The modular packaging system as set forth in claim 1, wherein each module further includes means, disposed in the cabinet, for distributing air forced through the interior by the air forcing means in a primary air flow pattern.

7. The modular packaging system as set forth in claim 6, wherein, in each module, the air forcing means includes a pair of fans and the distributing means is formed such that, upon failure of either one of the fans, a secondary air flow pattern is established which provides sufficient air flow through the interior.

8. The modular packaging system as set forth in claim 1, wherein each module further includes an air-permeable subrack assembly adapted for mounting the electrical equipment therein, the subrack assembly being mounted in the cabinet such that first and second spaces are formed between the subrack assembly and the cabinet, the first and second spaces extending to the first and second openings, respectively.

9. The modular packaging system as set forth in claim 1, further comprising a base upon which a vertical stack of modules is mountable.

10. A modular packaging system for electrical equipment, comprising:
    two or more modules adapted to enclose electrical equipment, each module including
    a cabinet including an interior adapted to receive the electrical equipment, the cabinet including an inner cabinet wall forming an air shaft, the cabinet being formed with a first and a second opening, the second opening being formed in the inner cabinet wall, and means for forcing air through the first opening of the cabinet, through the interior, out the second opening of the cabinet, and into the air shaft such that the interior of the cabinet is continuously cooled;

a chimney formed by aligning the air shafts of two or more modules arranged vertically relative to one another; and a chimney cover attachable above the chimney, wherein, in each module, the air forcing means includes a housing, a top surface of the housing of a top one of the two or more vertically arranged modules and the cover forming a top cover of a stack of modules.

11. A modular packaging system for a radio base station, comprising:

two or more modules adapted to enclose electrical equipment, each module including a rectangular cabinet having eight corners defining an interior adapted to receive the electrical equipment, the cabinet being formed with a first and a second opening, the cabinet further being formed with a first vertical space extending between a top and a bottom opening, the first vertical space being disposed within the eight corners of the cabinet, the cabinet further having a vertical inner cabinet wall and a rear cabinet wall, the inner cabinet wall and the rear cabinet wall defining a second vertical space, the second opening extending through the inner cabinet wall, and means for forcing air through the first opening of the cabinet, through the interior of the cabinet, out the second opening of the cabinet, and into the second vertical space such that the interior of the cabinet is continuously cooled;

a vertical cable chute formed by aligning the first vertical spaces of two or more modules arranged vertically relative to one another; and a chimney formed by aligning the second vertical spaces of the two or more modules arranged vertically relative to one another.

12. A modular packaging system for a radio base station, comprising:

two or more modules adapted to enclose electrical equipment, each module including a cabinet in which the electrical equipment is disposed, the cabinet being formed with a first and a second opening, the cabinet further being formed with a horizontal space extending between a front of the cabinet and a rear opening in a rear wall of the cabinet, and means for forcing air through the first opening of the cabinet, through the interior of the cabinet, and out the second opening of the cabinet such that the interior of the cabinet is continuously cooled; and a horizontal cable chute formed by aligning the horizontal spaces of two or more of the modules arranged horizontally, rear wall to rear wall, relative to one another, such that the horizontal cable chute extends from a front of a first one of the cabinets to a front of a second one of the cabinets.

13. The modular packaging system as set forth in claim 12, the modular packaging system comprising three or more modules, wherein, in each module, the cabinet further includes a vertical space extending between a top and a bottom opening in the cabinet, the modular packaging system further comprising a vertical cable chute formed by aligning the vertical spaces of two or more of the modules arranged vertically relative to one another.

14. A module for a modular packaging system, comprising:

a cabinet, the cabinet having four sides and four horizontal arms extending in the same direction from four corners of the cabinet, the cabinet including a cover removably attachable to ends of the four arms, the cover, the arms, and the sides defining top and bottom cabinet openings between which a vertical space extends and left and right cabinet openings between which a horizontal space extends, the cover being formed with apertures, the cabinet being formed with an outlet opening;

an air-permeable subrack assembly, electrical equipment being adapted to be mounted in the interior of the subrack assembly, the subrack assembly being mounted in the cabinet such that first and second spaces are formed between the subrack assembly and the cabinet, the first and second spaces extending to the apertures in the cover and the outlet opening, respectively; and means for forcing air through the apertures in the cover, through the subrack assembly, and out the outlet opening of the cabinet to permit continuous cooling of the interior of the subrack assembly;

wherein the module is adapted to be vertically arranged relative to another module such that the vertical spaces of the modules are aligned, and the module is adapted to be horizontally arranged relative to another module such that the horizontal spaces of the modules are aligned.

15. The module as set forth in claim 14, further comprising means, disposed both on the exterior of and on the interior of the subrack assembly, for forming electrical connections with electrical equipment mounted in the interior of the subrack assembly.

16. The module as set forth in claim 15, wherein the subrack assembly and the electrical connection means provides electromagnetic shielding for equipment mounted in the interior of the subrack assembly.

17. The module as set forth in claim 14, wherein the cabinet further includes an interior cabinet wall defining, with a rear wall and portions of left and right walls of the cabinet, an air shaft, the air shaft extending between the outlet opening of the cabinet and a bottom opening of the cabinet, the interior cabinet wall being formed with an interior cabinet wall opening through which air forced by the air forcing means through the subrack assembly passes to the air shaft and out the outlet opening of the cabinet.

18. The module as set forth in claim 17, further comprising a passage extending between an opening in the inner cabinet wall and an opening in the rear wall and wherein, when the module is horizontally arranged relative to another module, the openings in the rear walls of the modules are aligned.

19. The module as set forth in claim 17, wherein, when the module is vertically arranged relative to another module, the air shafts of the modules are aligned and form a chimney.

20. The module as set forth in claim 17, wherein the inner cabinet wall resists deformation of the cabinet.

21. The module as set forth in claim 14, further comprising means, disposed in the cabinet, for distributing air forced through the subrack assembly by the air forcing means in a primary air flow pattern.

22. The module as set forth in claim 21, wherein the air forcing means includes a pair of fans and the distributing means is formed such that, upon failure of either one of the fans, a secondary air flow pattern is established through the subrack assembly which provides sufficient air flow through the subrack assembly.

23. The module as set forth in claim 21, wherein the air forcing means includes a housing disposed above the subrack assembly.

24. The module as set forth in claim 23, wherein the distributing means includes a plate formed with a pattern of apertures.

25. The module as set forth in claim 24, wherein the plate forms a bottom of the housing.

26. The module as set forth in claim 24, wherein the plate forms a top of the subrack.

27. The module as set forth in claim 24, wherein the plate is disposed between a bottom of the housing and a top of the subrack.

28. The module as set forth in claim 21, wherein the distributing means includes a plate formed with a pattern of apertures.

29. The module as set forth in claim 28, wherein the apertures are unevenly spaced.

30. The module as set forth in claim 14, wherein the module includes a rear wall in which an rear opening is formed and a passage extends between the rear opening and the first space and wherein, when the module is horizontally arranged relative to another module, the openings in the rear walls of the modules are aligned.

* * * * *